(12) United States Patent
Jeong et al.

(10) Patent No.: US 8,183,136 B2
(45) Date of Patent: May 22, 2012

(54) METHOD OF FORMING INSULATING LAYER AND METHOD OF MANUFACTURING TRANSISTOR USING THE SAME

(75) Inventors: Seong-Hoon Jeong, Masan-si (KR);
Dong-Chan Kim, Anyang-si (KR);
Yu-Gyun Shin, Seongnam-si (KR);
Soo-Jin Hong, Guri-si (KR);
Deok-Hyung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/950,592

(22) Filed: Nov. 19, 2010

(65) Prior Publication Data

US 2011/0124172 A1   May 26, 2011

(30) Foreign Application Priority Data

Nov. 24, 2009 (KR) .................. 10-2009-0114123

(51) Int. Cl.
*H01L 21/00* (2006.01)
(52) U.S. Cl. ......... 438/513; 438/788; 257/632; 257/639
(58) Field of Classification Search .................. 257/632, 257/639; 438/513, 788
See application file for complete search history.

(56) References Cited

U.S. PATENT DOCUMENTS

| | | | | |
|---|---|---|---|---|
| 4,623,912 A | * | 11/1986 | Chang et al. | 257/411 |
| 4,900,371 A | * | 2/1990 | Dexter et al. | 148/222 |
| 4,952,294 A | * | 8/1990 | Collins et al. | 204/192.11 |
| 5,582,880 A | * | 12/1996 | Mochizuki et al. | 427/569 |
| 5,720,642 A | * | 2/1998 | Hattori | 445/50 |
| 6,593,198 B2 | * | 7/2003 | Segawa | 438/303 |
| 6,660,597 B2 | * | 12/2003 | Furukawa et al. | 438/287 |
| 6,730,568 B2 | * | 5/2004 | Sohn | 438/289 |
| 7,867,923 B2 | * | 1/2011 | Mallick et al. | 438/791 |
| 2005/0130448 A1 | * | 6/2005 | Olsen et al. | 438/786 |
| 2006/0024864 A1 | * | 2/2006 | Nakanishi et al. | 438/107 |

FOREIGN PATENT DOCUMENTS

| | | |
|---|---|---|
| JP | 06-140392 | 5/1994 |
| KR | 10-2004-0004836 A | 1/2004 |
| KR | 10-2006-0130089 A | 12/2006 |

OTHER PUBLICATIONS

Stanley Wolf, Silicon Processing for the VLSI Era, Lattice Press, vol. 3, pp. 648-654.*

* cited by examiner

*Primary Examiner* — Jarrett Start
*Assistant Examiner* — Nicholas Tobergte
(74) *Attorney, Agent, or Firm* — Myers Bigel Sibley & Sajovec, P.A.

(57) ABSTRACT

Provided are a method of forming an insulating layer and a method of manufacturing a transistor using the method. The method of forming the insulating layer includes forming a preliminary insulating layer including silicon oxide ($SiO_2$) on a silicon (Si)-containing substrate. A reactive gas containing ammonia ($NH_3$) gas is supplied to the preliminary insulating layer. Nitrogen radicals (N*) and hydrogen radicals (H*) are generated from the ammonia gas using plasma. The hydrogen radicals combine with oxygen of the preliminary insulating layer, and the nitrogen radicals combine with the silicon oxide so that an insulating layer including hydroxides (OH) and silicon oxynitride (SiON) can be formed.

10 Claims, 10 Drawing Sheets

METHOD OF FORMING INSULATING LAYER AND METHOD OF MANUFACTURING TRANSISTOR USING THE SAME

CROSS-REFERENCE TO RELATED APPLICATION

This application claims priority under 35 U.S.C. §119 to Korean Patent Application No. 10-2009-0114123 filed on Nov. 24, 2009, the disclosure of which is hereby incorporated by reference in their entirety.

BACKGROUND

1. Field

Embodiments of the inventive concept relate to a method of forming an insulating layer and a method of manufacturing a transistor using the same and, more particularly, to a method of forming an insulating layer including silicon oxynitride and a method of manufacturing a transistor including the same.

2. Description of Related Art

Due to the increased demand for low-voltage high-performance semiconductor devices, a gate insulating layer with a small thickness has become strongly relied upon. However, since direct tunneling is the main cause of a gate leakage current, it is difficult to reduce the leakage current without increasing a physical thickness of the gate insulating layer. Therefore, it is necessary to develop a technique for reducing the leakage current without increasing an equivalent oxide thickness (EOT) of the gate insulating layer.

SUMMARY

Embodiments of the inventive concept provide a method of forming an insulating layer, which may reduce a leakage current without increasing an equivalent oxide thickness (EOT), and a method of forming a transistor using the same.

In accordance with an aspect of the inventive concept, a method of forming an insulating layer includes forming a preliminary insulating layer having silicon oxide ($SiO_2$) on a silicon (Si)-containing substrate. A reactive gas containing ammonia ($NH_3$) gas is supplied to the preliminary insulating layer. Nitrogen radicals (N*) and hydrogen radicals (H*) are generated from the ammonia gas using plasma. The nitrogen radicals react with the silicon oxide to generate silicon oxynitride (SiON), and the hydrogen radicals react with the silicon oxide to generate hydroxides (OH). Thus, an insulating layer including the silicon oxynitride and the hydroxides is formed.

In an embodiment, the method may further include removing the hydroxides from the insulating layer to prevent the hydroxides from reacting with silicon at an interface between the substrate and the insulating layer and forming the silicon oxide again.

In an embodiment, removing the hydroxides from the insulating layer may be performed using a thermal process.

In an embodiment, the insulating layer may further include SiH, SiO, $SiO_2$, SiN, and SiOHN.

In an embodiment, the reactive gas may further include argon (Ar) gas and nitrogen ($N_2$) gas.

In an embodiment, generating the nitrogen radicals and the hydrogen radicals from the ammonia gas using the plasma may be performed at a process temperature of about 200 to about 900° C. under a process pressure of about 20 to about 950 mT.

In an embodiment, the preliminary insulating layer may be formed to a thickness of about 5 to about 25 Å.

In accordance with another aspect of the inventive concept, a method of manufacturing a transistor includes forming a preliminary insulating layer including silicon oxide on a Si-containing substrate. A reactive gas including ammonia gas is supplied to the preliminary insulating layer. Nitrogen radicals and hydrogen radicals are generated from the ammonia gas using plasma. The nitrogen radicals react with the silicon oxide to generate the silicon oxynitride, and the hydrogen radicals react with the silicon oxide to generate hydroxides. Thus, a gate insulating layer including the silicon oxynitride and the hydroxide is formed. A gate electrode is formed on the gate insulating layer. Source and drain regions are formed in regions of the Si-containing substrate adjacent to the gate electrode.

In an embodiment, the hydroxides may be removed from the gate insulating layer using a thermal process.

In an embodiment, the substrate may include a memory area and a logic area, and the transistor may be formed in the logic area.

In an embodiment, the gate insulating layer may further include SiH, SiO, $SiO_2$, SiN, and SiOHN.

In an embodiment, the reactive gas may further include argon gas and nitrogen gas.

In an embodiment, generating the nitrogen radicals and the hydrogen radicals from the ammonia gas using the plasma may be performed at a process temperature of about 200 to about 900° C. under a process pressure of about 20 to about 950 mT.

In an embodiment, the preliminary gate insulating layer may be formed to a thickness of about 5 to about 25 Å.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
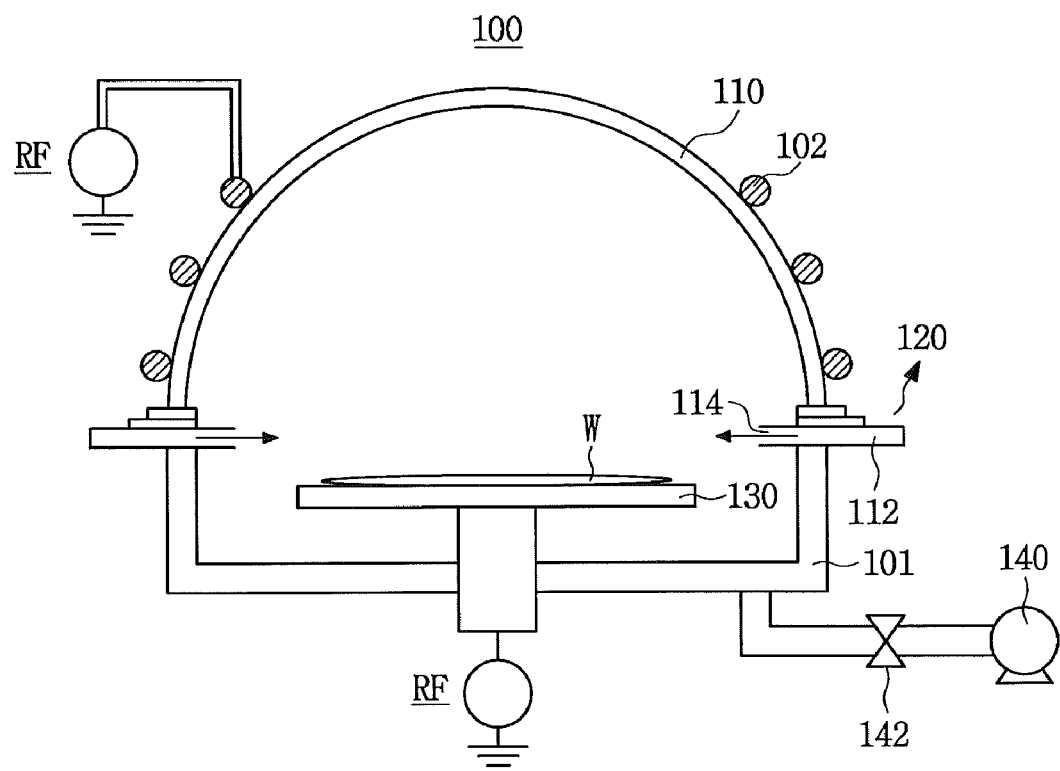
FIG. 1 is a cross-sectional view of a plasma process chamber used in embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be twined a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a plasma process chamber used in embodiments of the inventive concept.

Referring to FIG. 1, a plasma process apparatus 100 may be applied to a nitridation process of a thin layer (not shown) formed on a substrate W. Also, the plasma process apparatus 100 may employ decoupled plasma.

The plasma process apparatus 100 may include a process chamber 101 configured to provide a process space, an upper electrode 110, a gas supplier 120, a chuck assembly 130, a lower electrode (not shown), and a pump 140.

The upper electrode 110 may be disposed in an upper inner portion of the process chamber 101. The upper electrode 110 may include coils 102 to which radio-frequency (RF) waves are applied. According to embodiments of the inventive concept, the upper electrode 110 may have a dome shape with the coils 102 surrounding an outer circumference of the process chamber 101.

The process chamber 101 may be connected to the gas supplier 120, which may include a gas ring 112. The gas ring 112 may be connected to an end portion of the upper electrode 110 and include a plurality of process nozzles 114 configured to supply a process gas to a process space between the upper electrode 110 and the lower electrode. The process nozzles 114 may communicate with the gas ring 112 and be spaced apart from one another at regular intervals.

The chuck assembly 130 may be included in a process space of the process chamber 101 opposite the upper electrode 110. The chuck assembly 130 may support and fix the substrate W loaded in the process chamber 101 to be opposite the upper electrode 110.

The lower electrode may be disposed in the process chamber 101. For example, the lower electrode may be included in the chuck assembly 130. Also, RF waves may be applied to the lower electrode.

The pump 140 may be connected to the process chamber 101 through a valve 142 installed outside the process chamber 101. The pump 140 may evacuate the process chamber 101 during the nitridation of the thin layer formed on the substrate 101 in the process chamber 101. For example, a process gas for the nitridation process may be injected into the process chamber 101 so that an inner pressure of the process chamber can be temporarily increased. Thus, the increased inner pressure of the process chamber 101 may be reduced to a required appropriate pressure using the pump 140.

Also, due to the pumping operation of the pump 140, the inside of the process chamber 101 may be maintained under a required process pressure, and unreacted gases remaining in the process chamber 101 and reaction by-products generated during the nitridation process may be discharged from the process chamber 101.

Hereinafter, a method of forming an insulating layer using the plasma process apparatus 100 of FIG. 1 will be described.

Embodiment 1

Figure 2:
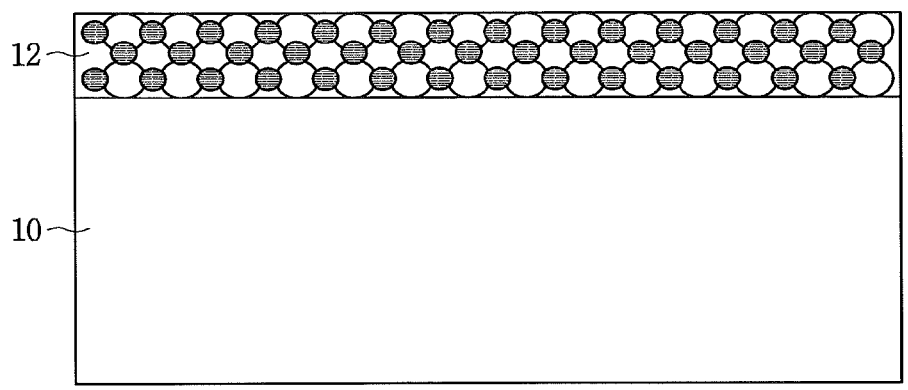
FIGS. 2 through 4 are cross-sectional views illustrating a method of forming an insulating layer according to embodiments of the inventive concept.
Figure 3:
Figure 3:
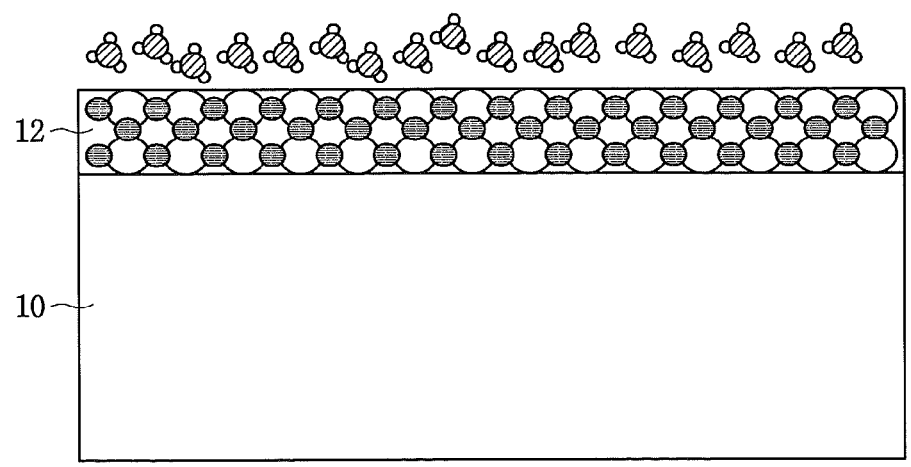
Figure 4:
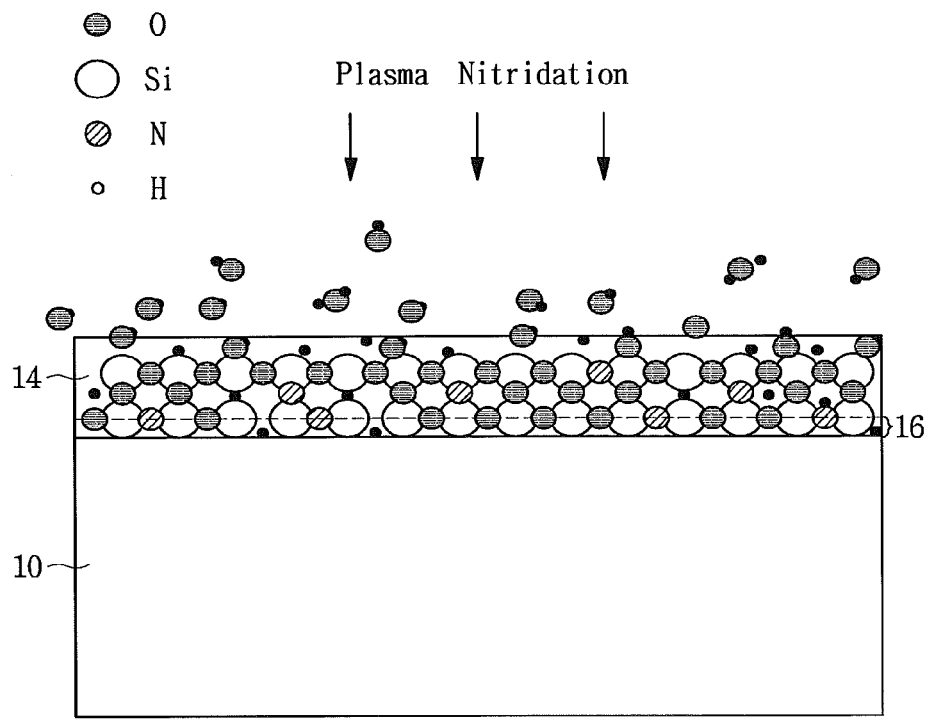

FIGS. 2 through 4 are cross-sectional views illustrating a method of forming an insulating layer according to embodiments of the inventive concept.

Referring to FIG. 2, a substrate 10 may be prepared. The substrate 10 may include silicon (Si). According to some embodiments of the inventive concept, the substrate 10 may include amorphous silicon (a-Si), single crystalline silicon, or polycrystalline silicon (poly-Si). According to other embodiments of the inventive concept, the substrate 10 may include silicon doped with impurities. The impurities may include one selected from Group III and V elements of the Mendeleev periodic table.

A preliminary insulating layer 12 including silicon oxide may be formed on the substrate 10. The preliminary insulating layer 12 may be formed using a thermal oxidation process or a chemical vapor deposition (CVD) process.

According to embodiments of the inventive concept, the preliminary insulating layer 12 may be formed to a thickness of about 5 to 25 Å. When the preliminary insulating layer 12 has a greater thickness than about 25 Å, oxygen in the preliminary insulating layer 12 may not combine with silicon of the substrate 10. In this case, a re-oxidation layer may not be formed at an interface between the substrate 10 and the preliminary insulating layer 12 during a subsequent plasma nitridation process.

When the preliminary insulating layer 12 has a smaller thickness than about 5 Å, since each silicon atom included in the preliminary insulating layer 12 has a size of about 5 Å, the formation of the preliminary insulating layer 12 may not be facilitated. Thus, the preliminary insulating layer 12 may be formed to a thickness of about 5 to 25 Å.

Referring to FIG. 3, the substrate 10 having the preliminary insulating layer 12 may be transferred to a plasma process chamber. The plasma process chamber may be the nitridation plasma process chamber of FIG. 1.

A reactive gas containing ammonia ($NH_3$) gas may be supplied to the process chamber. The reactive gas may be supplied to the process space over the preliminary insulating layer 12 loaded in the process chamber.

According to embodiments of the inventive concept, the reactive gas may further include an inert gas to generate plasma. For example, the inert gas may be Ar gas. According to other embodiments of the inventive concept, the reactive gas may contain nitrogen ($N_2$) gas.

Referring to FIG. 4, plasma may be generated in the process chamber. The inside of the process chamber may be maintained at a temperature of about 200 to 900° C. under a process pressure of about 20 to 950 mT.

The reactive gas in the process chamber may be converted into unstable radicals under the above-described temperature and pressure conditions. According to some embodiments of the inventive concept, the ammonia gas may be converted into nitrogen radicals and hydrogen radicals. The nitrogen and hydrogen radicals may be in unstable states and highly reactive.

The reactive gas may further include argon gas and nitrogen gas. The Ar gas, which is an inert gas, may facilitate conversion of ammonia gas into radicals. The nitrogen gas may be converted into nitrogen radicals or facilitate generation of radicals from the ammonia gas.

The nitrogen and hydrogen radicals formed in the process chamber may react with silicon oxide of the preliminary insulating layer 12.

According to some embodiments of the inventive concept, the nitrogen radicals may react with the silicon oxide of the preliminary insulating layer 12 to generate silicon oxynitride. Thus, an insulating layer 14 containing silicon oxynitride may be formed on the substrate 10.

The hydrogen radicals may react with the silicon oxide of the preliminary insulating layer 12 to form hydroxides. The hydrogen radicals may be highly reactive, and oxygen atoms may be highly electronegative. Thus, the hydrogen and oxygen radicals may rapidly and easily combine with each other to form the hydroxides.

The hydroxides may be removed using a subsequent process. According to some embodiments of the inventive concept, the subsequent process may be a high-temperature thermal process.

Also, a re-oxidation layer 16 may be formed at an interface between the insulating layer 14 and the substrate 10. The re-oxidation layer 16 may include silicon oxide. Oxygen of the insulating layer may react with silicon of the substrate, thereby forming the re-oxidation layer 16.

Also, the chance of causing combination of oxygen of the preliminary insulating layer 12 with silicon of the substrate 10 may be reduced due to high reactivity between the hydrogen radicals and the oxygen atoms. According to some embodiments of the inventive concept, when the preliminary insulating layer 12 has a thickness of about 5 to 25 Å, the thickness of the re-oxidation layer 16 formed at the interface between the preliminary insulating layer 12 and the substrate 10 may be markedly reduced.

Reaction intermediates may be generated in the process space of the process chamber or the insulating layer 14. According to some embodiments of the inventive concept, the reaction intermediates may contain SiH, SiO, $SiO_2$, SiN, and SiOHN. The combinations of the reaction intermediates may be continuously generated or extinguished and may be chemically unstable.

The reaction intermediates may be removed using the subsequent process. For example, the subsequent process may be a high-temperature thermal process.

In the insulating layer 14, hydrogen radicals may combine with oxygen atoms to form hydroxides. The hydroxides may reduce the chance to cause combination of the oxygen with silicon of the substrate 10. Thus, the thickness of the re-oxidation layer 16 formed at the interface between the insulating layer 14 and the substrate 10 may be reduced. A reduction in thickness of the re-oxidation layer 16 may lead to a reduction in equivalent oxide thickness (EOT).

Embodiment 2

Figure 5:
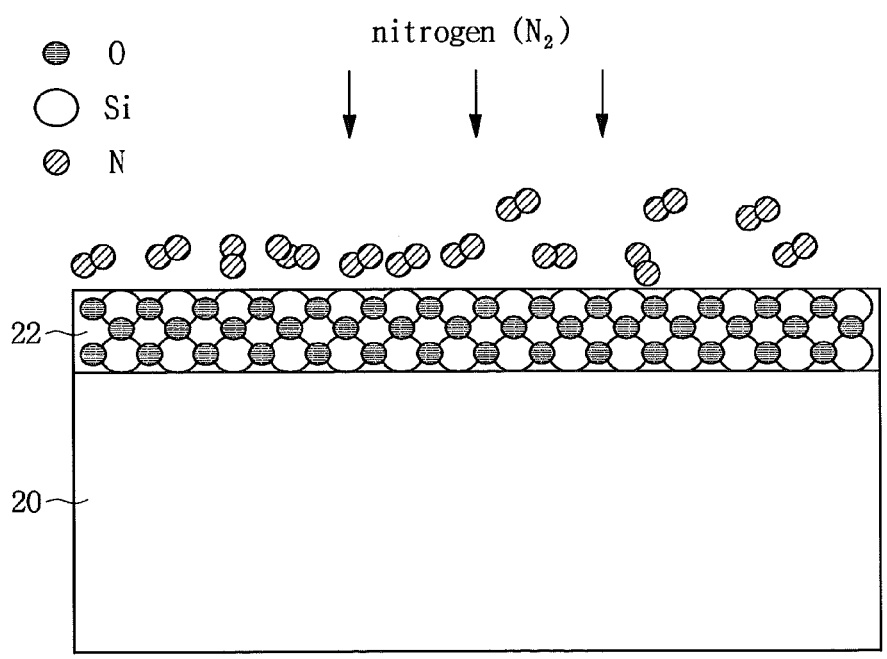
FIGS. 5 and 6 are cross-sectional views illustrating a method of forming an insulating layer according to other embodiments of the inventive concept.
Figure 6:
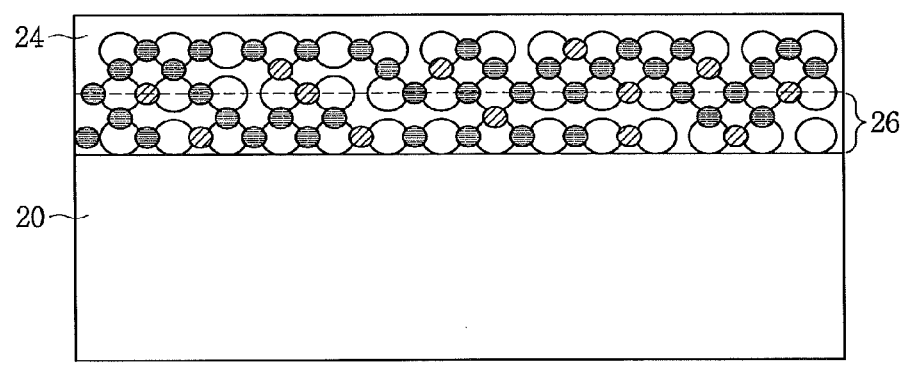

FIGS. 5 and 6 are cross-sectional views illustrating a method of forming an insulating layer according to other embodiments of the inventive concept.

Referring to FIG. 5, a substrate 20 may be prepared. The substrate 20 may include silicon. According to some embodiments of the inventive concept, the substrate 20 may include a-Si, single-crystalline Si, or poly-Si. According to other embodiments of the inventive concept, the substrate 20 may include silicon doped with impurities. The impurities may include one selected from Group III and V elements of the Mendeleev periodic table.

A preliminary insulating layer 22 including silicon oxide may be formed on the substrate 20. The preliminary insulating layer 22 may be formed using a thermal oxidation process or a CVD process.

According to some embodiments of the inventive concept, the preliminary insulating layer 22 may be formed to a thickness of about 5 to 25 Å. When the preliminary insulating layer 22 has a greater thickness than about 25 Å, oxygen in the preliminary insulating layer 22 may not combine with silicon of the substrate 20. In this case, a re-oxidation layer may not be formed at an interface between the substrate 20 and the preliminary insulating layer 22 during a subsequent plasma nitridation process.

When the preliminary insulating layer 22 has a smaller thickness than about 5 Å, since each silicon atom included in the preliminary insulating layer 22 has a size of about 5 Å, the formation of the preliminary insulating layer 22 may not be facilitated. Thus, the preliminary insulating layer 22 may be formed to a thickness of about 5 to 25 Å.

The substrate having the preliminary insulating layer 22 may be transferred to a plasma process chamber. The plasma process chamber may be the nitridation plasma process chamber of FIG. 1.

A reactive gas containing nitrogen gas may be supplied to the process chamber. The reactive gas may be supplied to a process space over the preliminary insulating layer 22 loaded in the process chamber.

According to embodiments of the inventive concept, the reactive gas may further include an inert gas to generate plasma.

Referring to FIG. 6, plasma may be generated in the process chamber. The inside of the process chamber may be maintained at a temperature of about 200 to 900° C. under a process pressure of about 20 to 950 mT.

The reactive gas in the process chamber may be converted into unstable radicals under the above-described temperature and pressure conditions. According to some embodiments of the inventive concept, the ammonia gas may be converted into nitrogen radicals. The nitrogen radicals may be in unstable states and highly reactive.

The reactive gas may further include Ar gas. The Ar gas, which is an inert gas, may facilitate conversion of nitrogen gas into nitrogen radicals.

According to some embodiments of the inventive concept, the nitrogen radicals may react with the silicon oxide to form silicon oxynitride. Thus, an insulating layer 24 containing the silicon oxynitride may be formed on the substrate 20.

Also, a re-oxidation layer 26 may be formed at an interface between the insulating layer 24 and the substrate 20. More specifically, oxygen of the insulating layer 24 may react with silicon of the substrate 20, thereby forming the re-oxidation layer 26. For example, when the insulating layer 24 is formed to a thickness of about 17 Å, the re-oxidation layer 26 may be formed to a thickness of about 1.5 Å so that an EOT can be about 18.5 Å.

Reaction intermediates may be generated in the insulating layer 24. The combinations of the reaction intermediates generated during the plasma process may be continuously generated or extinguished and may be chemically unstable. For example, the reaction intermediates may include SiO and SiN. The reaction intermediates may be removed using a subsequent process. The subsequent process may be a high-temperature thermal process.

Embodiment 3

FIGS. 7 through 13 are cross-sectional views illustrating a method of manufacturing a transistor using the method described with reference to FIGS. 2 through 4.

Figure 7:
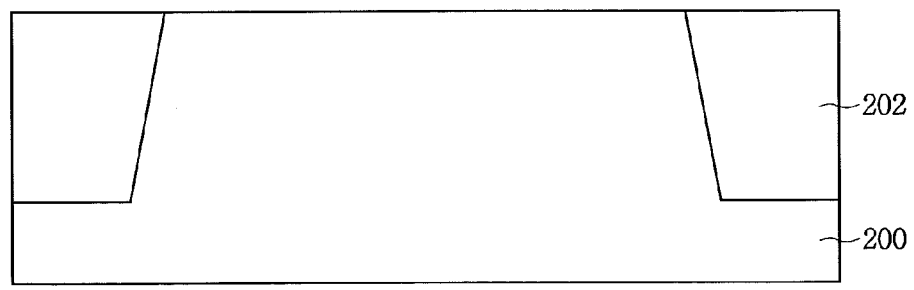
FIGS. 7 through 13 are cross-sectional views illustrating a method of manufacturing a transistor using the method described with reference to FIGS. 2 through 4.

Referring to FIG. 7, an isolation pattern 202 may be formed in a substrate 200.

The substrate 200 may include silicon. According to some embodiments of the inventive concept, the substrate 200 may include a-Si, single crystalline Si, and poly-Si. According to other embodiments of the inventive concept, the substrate 200 may include silicon doped with impurities. The impurities may include one selected from Group III and V elements of the Mendeleev periodic table.

More specifically, the formation of the isolation pattern 202 may include sequentially forming a pad oxide layer (not shown) and a first mask (not shown) on the substrate 200. The pad oxide layer may be formed of silicon oxide using a thermal oxidation process. The first mask may include a stacked structure of a nitride pattern and a photoresist pattern. The pad oxide layer and the substrate 200 may be etched using the first mask as an etch mask, thereby forming a pad oxide pattern (not shown) and a trench (not shown). Optionally, a liner (not shown) including silicon oxide and silicon nitride may be continuously formed along a surface profile of an inner lateral surface of the trench. An isolation layer (not shown) may be formed in the substrate 200 to fill the trench. Thereafter, an upper portion of the isolation layer may be planarized using a CMP process and an etchback process, thereby forming an isolation pattern 202. The isolation pattern 202 may function as a field region. The field region may define the active region. For example, the active region may have a line shape extending in a first direction. After forming the isolation pattern 202, the pad oxide pattern and the first mask may be removed from the substrate 200.

Figure 8:
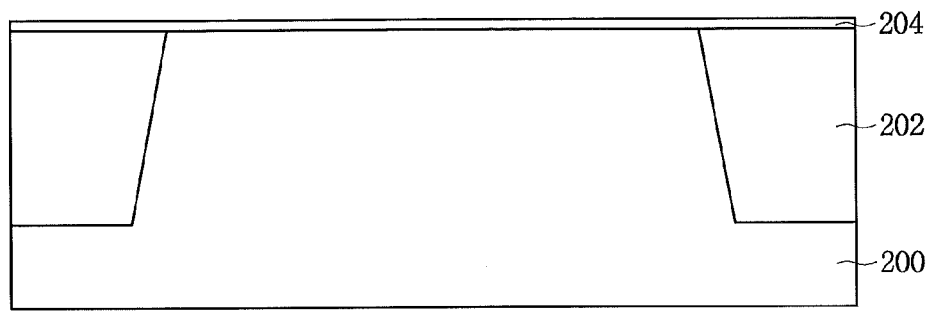

Referring to FIG. 8, a preliminary gate insulating layer 204 including silicon oxide may be formed on the substrate 200 having the isolation pattern 202. The preliminary gate insulating layer 204 may be formed using a thermal oxidation process or a CVD process.

According to some embodiments of the inventive concept, the preliminary insulating layer 24 may have a thickness of about 5 to 25 Å. When the preliminary insulating layer 204 has a greater thickness than about 25 Å, oxygen of the preliminary gate insulating layer 204 may not combine with silicon of the substrate 200. In this case, a re-oxidation layer may not be formed at an interface between the substrate 200 and the preliminary insulating layer 204 during a subsequent nitridation process.

When the preliminary gate insulating layer 204 has a smaller thickness than about 5 Å, since each silicon atom included in the preliminary insulating layer 204 has a size of about 5 Å, the formation of the preliminary insulating layer 204 may not be facilitated. Thus, the preliminary insulating layer 204 may be formed to a thickness of about 5 to 25 Å.

Figure 9:
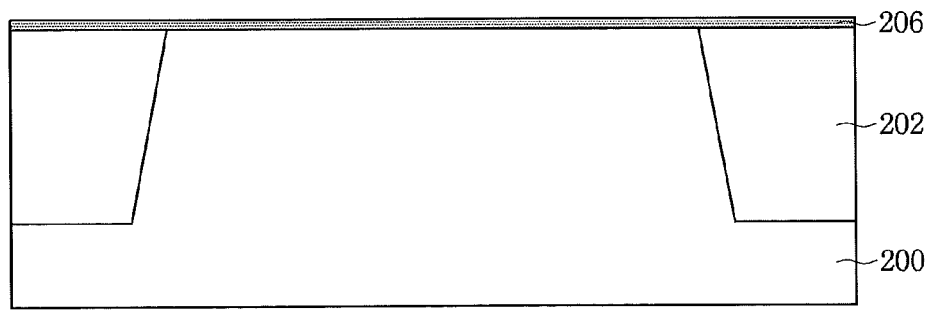

Referring to FIG. 9, the substrate 200 having the preliminary gate insulating layer 204 may be transferred to a plasma process chamber. The plasma process chamber may be the nitridation plasma process chamber of FIG. 1.

According to some embodiments of the inventive concept, a reactive gas containing ammonia gas may be supplied to the process chamber. The reactive gas may be supplied to a process space over the preliminary gate insulating layer 204 loaded in the process chamber.

According to embodiments of the inventive concept, the reactive gas may further include an inert gas to generate plasma. For example, the inert gas may be Ar gas. According to other embodiments of the inventive concept, the reactive gas may include nitrogen gas.

Plasma may be generated in the process chamber. The inside of the process chamber may be maintained at a temperature of about 200 to 900° C. under a process pressure of about 20 to 950 mT.

The reactive gas in the process chamber may be converted into unstable radicals under the above-described temperature and pressure conditions. According to some embodiments of the inventive concept, the ammonia gas may be converted into nitrogen radicals and hydrogen radicals. The nitrogen and hydrogen radicals may be in unstable states and highly reactive.

The reactive gas may further include Ar gas and nitrogen gas. The Ar gas, which is an inert gas, may facilitate conversion of ammonia gas into radicals. The nitrogen gas may be converted into nitrogen radicals or facilitate generation of radicals from the ammonia gas.

The nitrogen and hydrogen radicals formed in the process chamber may react with silicon oxide of the preliminary insulating layer 204.

According to some embodiments of the inventive concept, the nitrogen radicals may react with the silicon oxide of the preliminary insulating layer 204 to generate silicon oxynitride. Thus, an insulating layer 206 containing silicon oxynitride may be formed on the substrate 200.

The hydrogen radicals may react with the silicon oxide of the preliminary insulating layer 12 to form hydroxides. The hydrogen radicals may be highly reactive, and oxygen atoms may be highly electronegative. Thus, the hydrogen and oxygen radicals may rapidly and easily combine with each other to form the hydroxides.

The hydroxides may be removed using a subsequent process. According to some embodiments of the inventive concept, the subsequent process may be a high-temperature thermal process.

Also, the chance of causing combination of oxygen of the preliminary insulating layer 204 with silicon of the substrate 200 may be reduced due to high reactivity between the hydrogen radicals and oxygen atoms. According to some embodiments of the inventive concept, when the preliminary insulating layer 204 has a thickness of about 5 to 25 Å, the thickness of the re-oxidation layer formed at the interface between the preliminary insulating layer 204 and the substrate 200 may be markedly reduced.

Reaction intermediates may be generated in the process space of the process chamber or the gate insulating layer 206. According to some embodiments of the inventive concept, the reaction intermediates may include SiH, SiO, $SiO_2$, SiN, and SiOHN. The combinations of the reaction intermediates may be continuously generated or extinguished and may be chemically unstable.

The reaction intermediates may be removed using the subsequent process. For example, the subsequent process may be a high-temperature thermal process.

In the insulating layer 206, hydrogen radicals may combine with oxygen atoms to form hydroxides. The hydroxides may reduce a chance to cause combination of oxygen with silicon of the substrate 200. Thus, the thickness of a re-oxidation layer formed at the interface between the insulating layer 206 and the substrate 200 may be reduced. A reduction in thickness of the re-oxidation layer may lead to a reduction in EOT.

Figure 10:
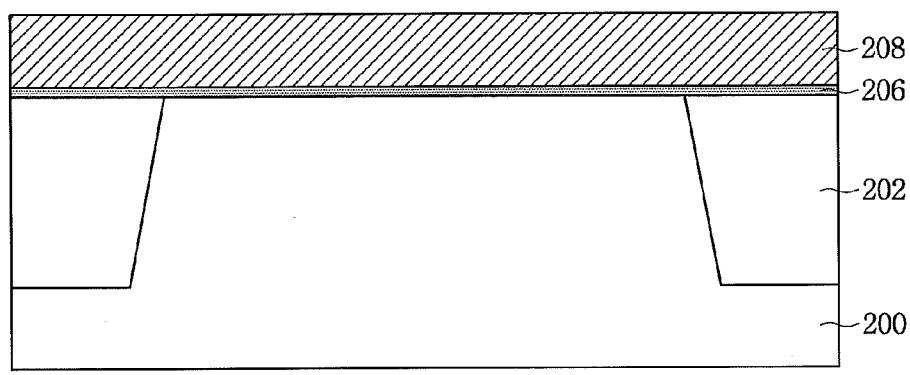

Referring to FIG. 10, a conductive layer 208 may be formed on the gate insulating layer 206.

The conductive layer 208 may include a metal, a metal compound, or doped silicon. For example, the conductive layer 208 may have a single layer structure including the metal, the metal compound, or the doped silicon. As another example, the conductive layer 208 may have a multilayered structure including one selected from the group consisting of the metal, the metal compound, and the doped silicon.

The conductive layer 208 may be formed using a physical vapor deposition (PVD) process, an atomic layer deposition (ALD) process, or a CVD process.

Figure 11:
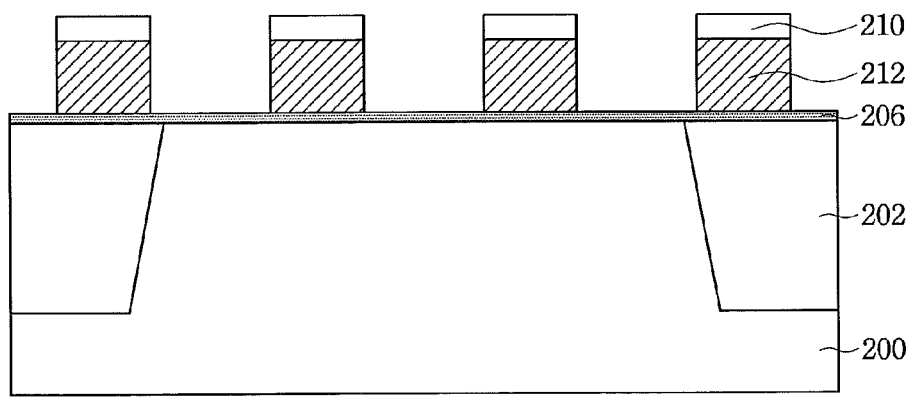

Referring to FIG. 11, a second mask 210 may be formed on the conductive layer 208. The second mask 210 may include nitride, for example, silicon nitride.

The conductive layer 208 may be etched using the second mask 210 as an etch mask, thereby forming a gate electrode 212. The gate electrode 212 may extend in a second direction that is substantially different from the first direction. For example, the second direction may be perpendicular to the first direction.

Figure 12:
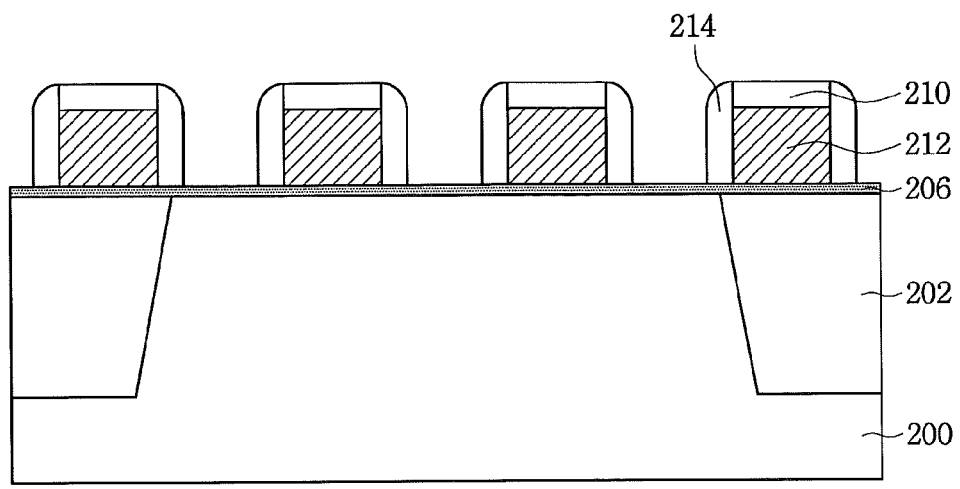

Referring to FIG. 12, a thin layer (not shown) may be continuously formed along surfaces of the gate electrode 212 and the substrate 200. The thin layer may include nitride, for example, silicon nitride.

The thin layer may be anisotropically etched, thereby forming spacers 214 on both lateral surfaces of the gate electrode 212. The anisotropic etching process may be a plasma etching process.

Figure 13:
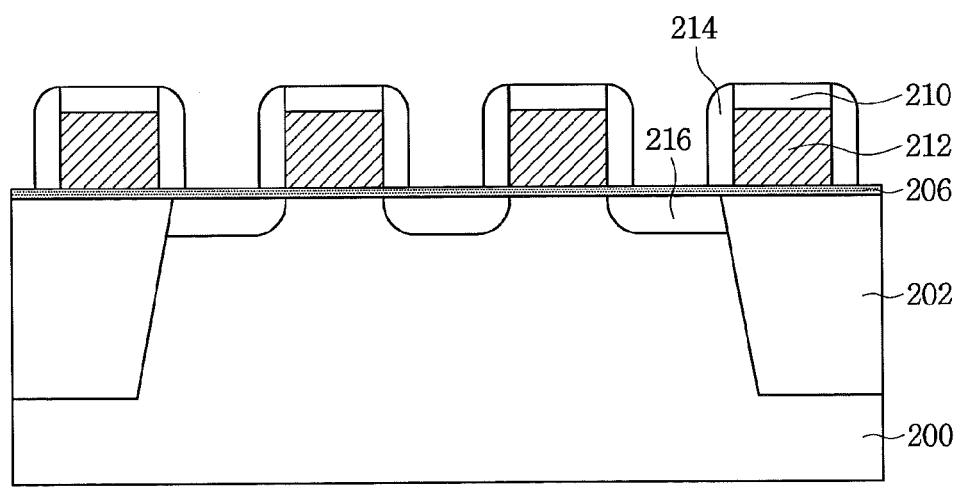

Referring to FIG. 13, impurities may be implanted into regions of the substrate 200 adjacent to the spacers 214, thereby forming source and drain regions 216.

According to some embodiments of the inventive concept, the source and drain regions 216 may be formed using an ion implantation process and a diffusion process. More specifically, the formation of the source and drain regions 216 may include ionizing an arbitrary element to generate beams, accelerating high-energy beams to implant ions, and thermally diffusing the ions at a high temperature to form the source and drain regions 216 on both sides of the gate electrode 212.

According to other embodiments of the inventive concept, lightly doped drain (LDD)-type source and drain regions may be provided.

Although the present embodiments of the inventive concept exemplarily describe a planar-type transistor, the embodiments of the inventive concept are not limited thereto. For example, the embodiments of the inventive concept may also be applied to a transistor with a recessed channel or a fin field effect transistor (FinFET).

Furthermore, a transistor according to embodiments of the inventive concept may be applied to a memory device, such as a dynamic random access memory (DRAM), or a logic device.

Experimental Example

Figure 14:
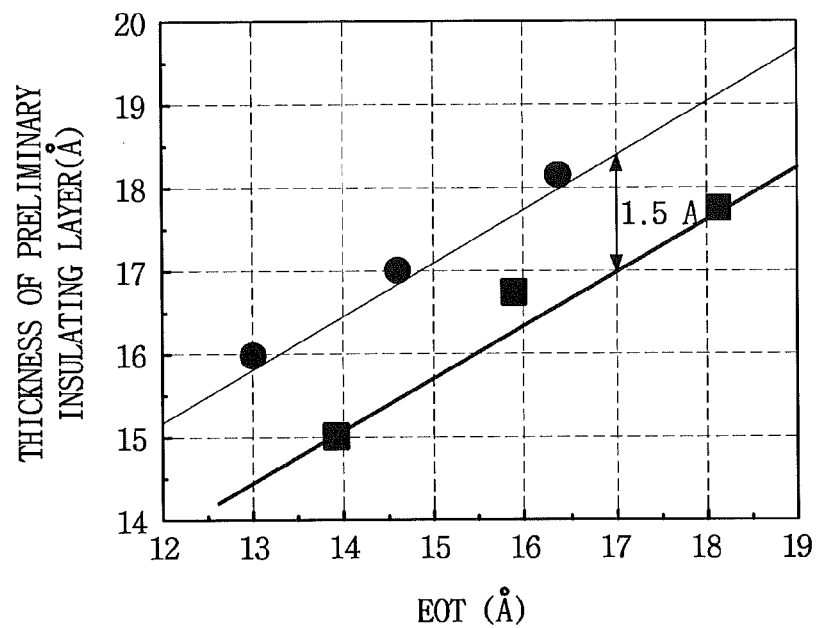
FIG. 14 is a graph showing an equivalent oxide thickness (EOT) of each of the insulating layers according to the embodiments of the inventive concept.

FIG. 14 is a graph showing an EOT of each of the insulating layers according to the embodiments of the inventive concept. In FIG. 14, an abscissa denotes the thickness (Å) of a preliminary insulating layer measured before a plasma nitridation process, and an ordinate denotes the EOT (Å) of the insulating layer measured after the plasma nitridation process. Also, in FIG. 14, —■— denotes the insulating layer formed according to the first method described with reference to FIGS. 2 through 4, and —■— denotes the insulating layer formed according to the second method described with reference to FIGS. 5 and 6.

Referring to FIG. 14, the formation of the insulating layer according to the first method included forming a preliminary insulating layer including silicon on a Si-containing substrate and performing a plasma nitridation process using ammonia gas as a reactive gas to form the insulating layer including silicon oxynitride. Thereafter, the EOT of the insulating layer was measured. For example, after the preliminary insulating layer was formed to a thickness of about 17 Å, when the plasma nitridation process according to the first method was performed, the insulating layer had an EOT of about 17 Å.

The formation of the insulating layer according to the second method included forming a preliminary insulating layer including silicon oxide on a Si-containing substrate and performing a plasma nitridation process using nitrogen gas as a reactive gas to form the insulating layer including silicon oxynitride. Thereafter, the EOT of the insulating layer was measured. For example, after the preliminary insulating layer was formed to a thickness of about 17 Å, when the plasma nitridation process according to the second method was performed, the insulating layer had an EOT of about 18.5 Å.

Referring to FIG. 14, it can be seen that the insulating layer formed according to the first method had an EOT about 1.5 Å smaller than the insulating layer formed according to the second method.

Figure 15:
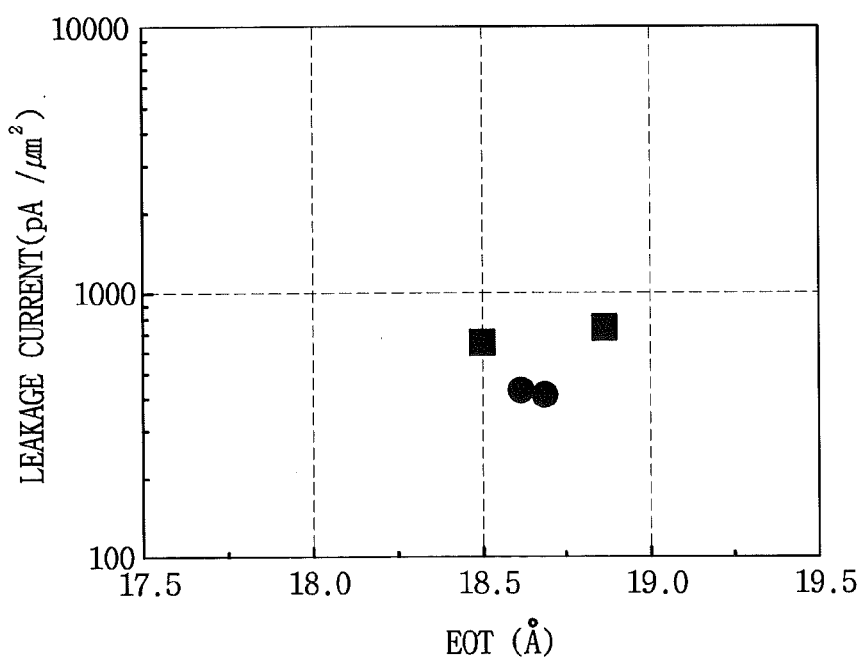
FIG. 15 is a graph showing a leakage current of each transistor including the insulating layers according to the embodiments of the inventive concept.

FIG. 15 is a graph showing a leakage current of each transistor including the insulating layers according to the embodiments of the inventive concept. In FIG. 15, an abscissa denotes an EOT (Å), and an ordinate denotes a leakage current (pA/μm$^2$). Also, in FIG. 15, —■— denotes a transistor including the insulating layer formed according to the first method described with reference to FIGS. 2 through 4, and —●— denotes a transistor including the insulating layer formed according to the second method described with reference to FIGS. 5 and 6.

Referring to FIG. 15, the formation of the insulating layer formed according to the first method included forming a preliminary insulating layer including silicon oxide on a Si-containing substrate and performing a plasma nitridation process using ammonia gas as a reactive gas to form the insulating layer including silicon oxynitride. The preliminary insulating layer had a thickness of about 18 Å, and the insulating layer had a thickness of about 18 Å. Thereafter, the leakage current of the transistor including the insulating layer was measured.

The formation of the insulating layer formed according to the second method included forming a preliminary insulating layer including silicon oxide on a Si-containing substrate and performing a plasma nitridation process using nitrogen gas as a reactive gas to form the insulating layer including silicon oxynitride. The preliminary insulating layer had a thickness of about 18 Å, and the insulating layer had a thickness of about 20 Å. Thereafter, the leakage current of the transistor including the insulating layer was measured.

Referring to FIG. 15, it can be seen that there was only a small difference of several hundred pA/μm$^2$ between the leakage currents of the transistors including the insulating layers formed according to the first and second methods. That is, although the EOT of the insulating layer formed according to the first method was reduced, the transistor including the insulating layer formed according to the first method had about the same leakage current as the transistor including the insulating layer formed according to the second method. Therefore, a low-voltage high-performance semiconductor device may be embodied.

Figure 16:
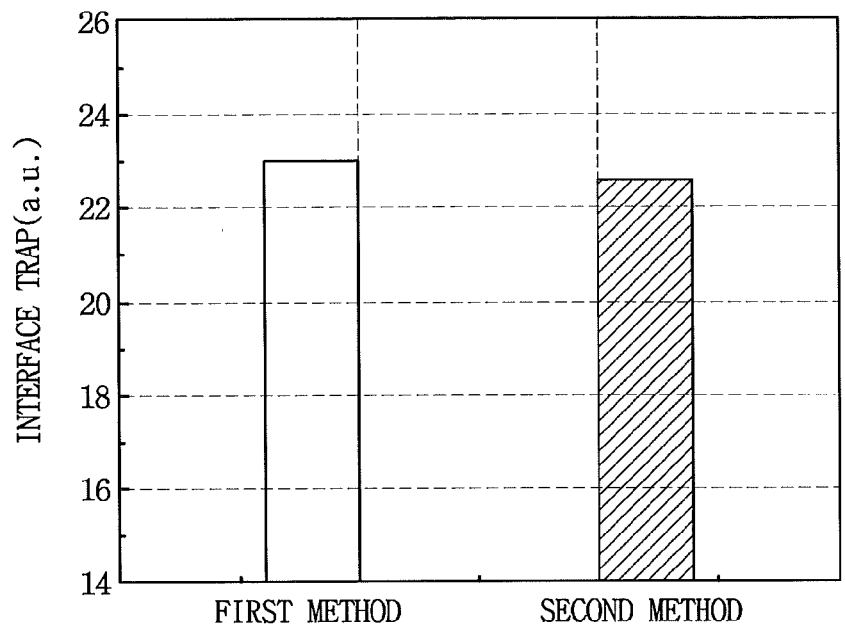
FIG. 16 is a graph showing the number of interface traps generated at an interface between a substrate and each of the insulating layers according to the embodiments of the inventive concept.

FIG. 16 is a graph showing the number of interface traps generated at an interface between a substrate and each of the insulating layers according to the embodiments of the inventive concept. In FIG. 16, an ordinate denotes the number of interface traps generated at the interface between the substrate and each of the insulating layers according to the first and second methods described with reference to FIGS. 2 through 6, and the number of interface traps is indicated by an arbitrary unit (a.u).

Referring to FIG. 16, the formation of the insulating layer formed according to the first method included forming a preliminary insulating layer including silicon oxide on a Si-containing substrate and performing a plasma nitridation process using ammonia gas as a reactive gas to form the insulating layer including silicon oxynitride. Thereafter, the number of interface traps generated at an interface between the insulating layer and the substrate was measured.

The formation of the insulating layer formed according to the second method included forming a preliminary insulating layer including silicon oxide on a Si-containing substrate and performing a plasma nitridation process using nitrogen gas as a reactive gas to form the insulating layer including silicon oxynitride. Thereafter, the number of interface traps generated at an interface between the insulating layer and the substrate was measured.

Referring to FIG. 16, the average number of interface traps formed between the insulating layer formed according to the first method and the substrate was about 23 a.u., and the average number of interface traps formed between the insulating layer formed according to the second method and the substrate was about 22.5 a.u. Thus, it can be seen that there was little difference in the average number of interfaces between the two cases.

Figure 17:
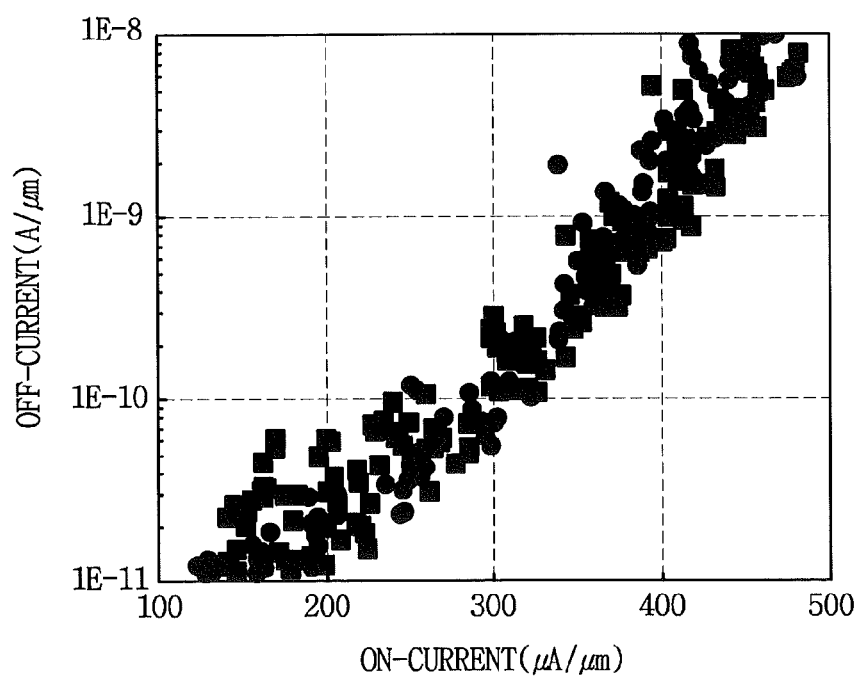
FIG. 17 is a graph showing the transition characteristics of NMOS transistors including the insulating layers according to the embodiments of the inventive concept.
Figure 18:
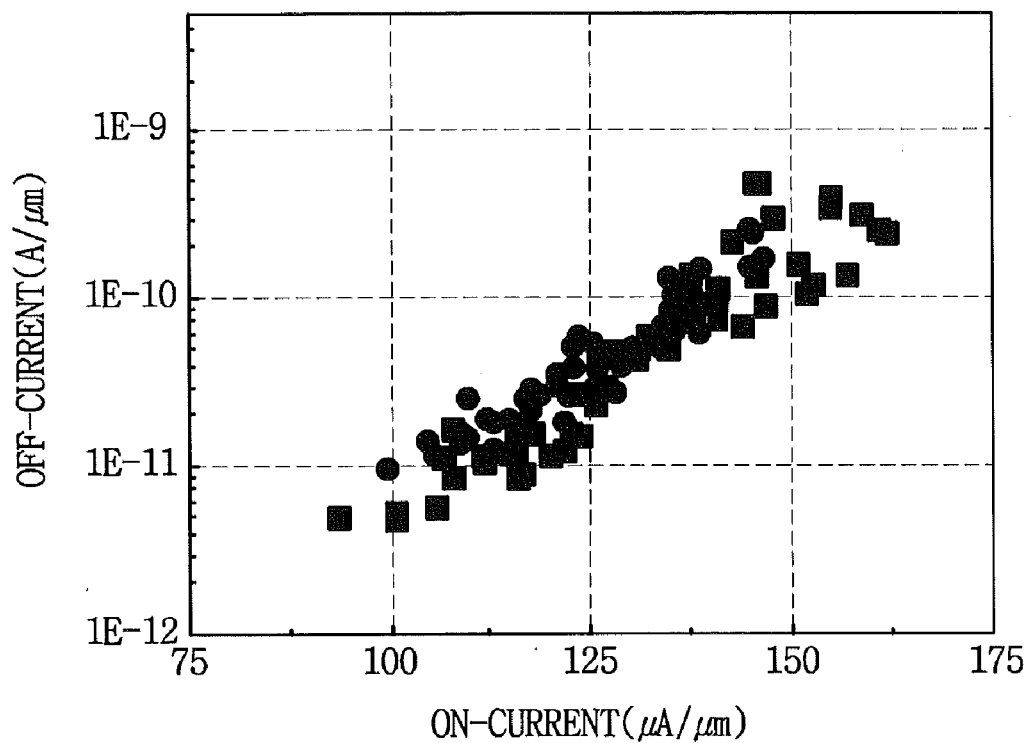
FIG. 18 is a graph showing the transistor characteristics of PMOS transistors including the insulating layers according to the embodiments of the inventive concept.

FIG. 17 is a graph showing the transition characteristics of NMOS transistors including the insulating layers according to the embodiments of the inventive concept, and FIG. 18 is a graph showing the transistor characteristics of PMOS transistors including the insulating layers according to the embodiments of the inventive concept.

In FIGS. 17 and 18, an abscissa denotes an on current (A/μm) of a MOS transistor, and an ordinate denotes an off current (μA/μm) of the MOS transistor. Also, in FIGS. 17 and 18, —■— denotes a MOS transistor including the insulating layer formed according to the first method described with reference to FIGS. 2 through 4, and —●— denotes a MOS transistor including the insulating layer formed according to the second method described with reference to FIGS. 5 and 6.

Referring to FIGS. 17 and 18, the formation of the insulating layer formed according to the first method included forming a preliminary insulating layer including silicon oxide on a Si-containing substrate and performing a plasma nitridation process using ammonia gas as a reactive gas to form the insulating layer including silicon oxynitride. Thereafter, the transition characteristics of each NMOS and PMOS transistor including the insulating layer were measured.

The formation of the insulating layer formed according to the second method included forming a preliminary insulating layer including silicon oxide on a Si-containing substrate and performing a plasma nitridation process using nitrogen gas as a reactive gas to form the insulating layer including silicon oxynitride. Thereafter, the transition characteristics of each NMOS and PMOS transistor including the insulating layer were measured.

Referring to FIGS. 17 and 18, it can be seen that there is little difference between the transition characteristics of the MOS transistors including the insulating layers formed according to the first and second methods.

Referring to FIGS. 14 through 18, the insulating layer formed according to the first method had a smaller EOT than the insulating layer formed according to the second method, thereby enabling fabrication of a low-voltage high-performance semiconductor memory device. Furthermore, although the insulating layer formed according to the first method had the smaller EOT than the insulating layer formed according to the second method, the leakage current of the transistor including the insulating layer formed according to the first method was substantially similar to that of the transistor including the insulating layer formed according to the second method.

According to the embodiments of the inventive concept, a plasma nitridation process may be performed on a preliminary insulating layer including silicon oxide using ammonia gas so that an EOT can be maintained small and a leakage current can be reduced.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming an insulating layer, comprising:
    forming a preliminary insulating layer having silicon oxide on a silicon containing substrate, wherein the preliminary insulating layer is formed to a thickness of about 5 to about 25 Å;
    supplying to the preliminary insulating nitrogen radicals and hydrogen radicals obtained from a reactive gas containing ammonia using plasma to generate silicon oxynitride by reaction of the nitrogen radicals with the silicon oxide, and to generate hydroxides by reaction of the hydrogen radicals with the silicon oxide to form an insulating layer including the silicon oxynitride and the hydroxides
    wherein generating the nitrogen radicals and the hydrogen radicals from the ammonia gas using the plasma is performed at a process temperature of about 200 to about 900° C. under a process pressure of about 20 to about 950 mT.

2. The method of claim 1, further comprising removing the hydroxides from the insulating layer to prevent the hydroxides from reacting with silicon at an interface between the substrate and the insulating layer and forming the silicon oxide again.

3. The method of claim 2, wherein removing the hydroxides from the insulating layer is performed using a thermal process.

4. The method of claim 1, wherein the insulating layer that includes the silicon oxynitride and the hydroxides further comprises SiH, SiO, $SiO_2$, SiN, and SiOHN.

5. The method of claim 1, wherein the reactive gas further comprises argon gas and nitrogen gas to facilitate conversion of the ammonia gas into the nitrogen radicals and the hydrogen radicals due to the plasma.

6. A method of manufacturing a transistor, comprising:
    forming a preliminary insulating layer including silicon oxide on a Si-containing substrate, wherein the preliminary insulating layer is formed to a thickness of about 5 to about 25 Å;
    supplying to the preliminary insulating nitrogen radicals and hydrogen radicals obtained from a reactive gas containing ammonia using plasma to generate silicon oxynitride by reaction of the nitrogen radicals with the silicon oxide, and to generate hydroxides by reaction of the hydrogen radicals with the silicon oxide to form an insulating layer including the silicon oxynitride and the hydroxides,
    forming a gate electrode on the gate insulating layer; and
    forming source and drain regions in regions of the substrate adjacent to the gate electrode
    wherein generating the nitrogen radicals and the hydrogen radicals from the ammonia gas using the plasma is performed at a process temperature of about 200 to about 900° C. under a process pressure of about 20 to about 950 mT.

7. The method of claim 6, wherein the hydroxides are removed from the gate insulating layer using a thermal process.

8. The method of claim 6, wherein the substrate comprises a memory area and a logic area, and the transistor is formed in the logic area.

9. The method of claim 6, wherein the gate insulating layer that includes the silicon oxynitride and the hydroxides further comprises SiH, SiO, $SiO_2$, SiN, and SiOHN.

10. The method of claim 6, wherein the reactive gas further comprises argon gas and nitrogen gas.

* * * * *